United States Patent [19]

Suzuki

[11] Patent Number: 5,393,992
[45] Date of Patent: Feb. 28, 1995

[54] SEMICONDUCTOR THIN FILM TRANSISTOR WITH GATE CONTROLLED OFFSET PORTION

[75] Inventor: Yoshiyuki Suzuki, Tokyo, Japan
[73] Assignee: NEC Corporation, Tokyo, Japan
[21] Appl. No.: 997,678
[22] Filed: Dec. 28, 1992

[30] Foreign Application Priority Data

Dec. 28, 1991 [JP] Japan .................. 3-360583

[51] Int. Cl.$^6$ ........................... H01L 29/78
[52] U.S. Cl. ........................... 257/69; 257/72; 257/903
[58] Field of Search ............ 257/70, 66, 67, 69, 257/347, 408, 349, 350, 72, 903

[56] References Cited

U.S. PATENT DOCUMENTS

| | | | |
|---|---|---|---|
| 4,633,284 | 12/1986 | Hansell et al. | 257/60 |
| 4,980,732 | 12/1990 | Okazawa | 257/326 |
| 5,001,540 | 3/1991 | Ishihara | 257/329 |
| 5,233,207 | 8/1993 | Anzai | 257/71 |
| 5,298,764 | 3/1994 | Yamanaka et al. | 257/903 |

FOREIGN PATENT DOCUMENTS

| | | | |
|---|---|---|---|
| 4-14878 | 1/1992 | Japan | 257/408 |
| 4-17370 | 1/1992 | Japan | 257/66 |

*Primary Examiner*—Robert P. Limanek

[57] ABSTRACT

A lower gate type semiconductor device, in which, for increasing an on-current of a lower gate type thin film transistor and restricting an off-current, there is provided a gate-controlled offset region different from a channel region in one or both conductivity types. This region increases the on-current of the transistor, provides a reduction of a leakage current, and restriction of a subthreshold coefficient. A two-dimensional size can also be reduced by altering the gate height. The on-current is increased, and the leakage current is reduced in the device. The offset region is composed of a semiconductor material and is formed at the end of a drain region of the device.

34 Claims, 5 Drawing Sheets

SEMICONDUCTOR THIN FILM TRANSISTOR WITH GATE CONTROLLED OFFSET PORTION

BACKGROUND OF THE INVENTION

1. Field of the Invention

The present invention relates to a MOS (Metal Oxide Semiconductor) device formed on an insulating film, and more specifically to a lower gate type thin film transistor.

2. Description of the Prior Art

A typical MOS transistor controls conduction of a channel located between a source and a drain in a field effect manner by exerting voltage on a gate electrode formed through an oxide film on the channel located between a source region and a drain region formed on a single crystal silicon substrate. In contrast, another MOS transistor called a lower gate type thin film transistor, controls conduction of a channel region formed on a gate electrode disposed on a silicon substrate via an oxide film or an insulating substrate the channel region being formed between a source region and a drain region formed via a gate insulating film, by exerting voltage on the foregoing gate electrode located below the channel region. The latter MOS transistor is used for SRAMs (Static Random Access Memory) and liquid crystal panel driving transistors.

Referring to FIG. 1, there is illustrated an arrangement of a prior art lower gate type thin film transistor. Fabrication of such a transistor is as follows. As illustrated in FIG. 1(a), a silicon oxide film 6 is formed on a silicon substrate 1 and thereafter a conductive film is deposited. The conductive film is a polycrystalline silicon film in which for example a proper impurity is doped at high concentration. The conductive film is patterned to form a lower gate electrode 21 on which a silicon oxide film is in turn deposited as a gate insulating film 7. On the gate insulating film 7 a thin polycrystalline silicon film 11 is deposited to form an active region.

For fabrication of the thin polycrystalline film 11, frequent use is made of a process wherein an amorphous silicon film is first deposited and heat-treated at about 600° C. for a long time for polycrystallization. The polycrystalline silicon film 11 formed as such is ion-implanted locally into high concentration with impurity ion 41 with a photoresist film taken as a mask as illustrated in FIG. 1(b) for example to form a source region 22 and a drain region 26. On a masked portion of the polycrystalline silicon film 11 are formed a channel region 23 and an offset region 25. Thereafter, the impurily is activated with a heat treatment, and thus a basic structure of the illustrated lower gate type thin film transistor is formed. The resulting structure is called a lower gate type because of the provision of the gate electrode located below the active region. By reversing the fabrication order of the polycrystalline silicon film 11 as the active region and the gate electrode 21 an ordinary upper gate type thin film transistor can also be constructed.

The active region of the lower gate type field effect transistor constructed as described above comprises polycrystal which has a leakage current greater by three or more figures than that of single crystal silicon and further has an on-current lower by about four figures than that of the same. Prior practice to improve such difficulty includes heating (400° C.) in the atmosphere of hydrogen and hydrogen plasma processing. However, a gate length is shortened as the device is integrated, and hence electric field intensity applied between a source and a drain is increased upon devices being switched off and further the allowable limit of a leakage current is lowered. To solve the difficulty there is adopted a method where an offset region is provided on the drain side of the channel part.

Resulting P channel transistor exhibits characteristics of 0.9 pA leakage current and a 60 nA on-current under the conditions of 1 μm channel width and −3 V drain voltage. For applying the just-mentioned transistor to SRAMs (Static Random Memory) required to be fine and a high speed and to liquid crystal panel thin film transistors used at higher voltage, it is necessary to increase an on-current, decrease a leakage current, and make steep the driving of a drain current in gate voltage dependency.

SUMMARY OF THE INVENTION

To solve the difficulties with the prior art, it is an object of the present invention to provide a lower gate type semiconductor device capable of restriction of a leakage current (off-current) as well as of an increase of an on-current.

To achieve the above object, a semiconductor device according to the present invention is adapted such that a lower gate type transistor includes a portion controlled by a gate electrode in an electric field effect manner for increasing an effective gate length except a channel region, said portion controlled by a gate electrode in an electric field effect manner being formed at a drain end of a channel part which makes contact with the channel electrode via a gate insulation film, said portion being a gate-controlled portion composed of a semiconductor material formed at the end of the drain region in said channel region and being controlled by said gate electrode in an electric field effect manner, said portion serving to increase an effective gate length and functioning to weaken the electric field effect established in an area between said channel region and said drain region at a time of non-conduction of the device and to decrease resistance of said area at a time of conduction of the device.

A semiconductor device according to the present invention is further adapted such that there is provided a portion controlled by a gate electrode in an electric field effect manner in a lower gate type transistor for increasing an effectual gate length, said portion controlled by a gate electrode in an electric field effect manner being located at a build-up portion of the gate electrode where maximum gate height is higher than ½ of the gate length.

In accordance with a first aspect of the present invention, a gate-controlled offset part is provided at a drain end of the channel part controlled by the gate of the lower gate type thin film transistor. The gate-controlled offset part may be of any one of the two conductivity types and it may be the same as or different from that of the channel region but its effective carrier concentration is lower than that of the channel region or drain region, depending on its conductivity type. This portion is controlled by the gate electrode in an electric field effect manner, so that it is controlled in its on and off operation simultaneously with the channel part. The portion therefore provides a necessary resistance upon its being switched off and provides a low resistance part or a resistance ignorable part upon its being switched on. Thus, it ensures the same as in the prior art, or an increased on-current simultaneously with a suppressed off-current.

It is conventionally known that in an electric field effect transistor formed on a single crystal silicon, there is provided a portion where a dopant of the same conductivity type as those of a source and a drain is doped at low concentration at a drain end of a channel that puts an oxide film between it and a gate, the portion being controlled by the gate. This manifests an effect of withstanding voltage against hot carriers but it fails to shorten a two-dimensional size and a source-drain distance.

Against this, in accordance with a second aspect of the present invention, the leading edge height of the gate is increased to increase the lengths of portions controlled by the gate electrode such as the channel and the gate-controlled offset portion, so that influences of the deterioration of characteristics such as a short channel effect and of the lowering of long-term reliability can be avoided, with an area occupied by the two-dimensional gate kept at a small size. A preferred maximum gate height is at least ½ or higher of the gate length.

Further, with the gate height increased and with the channel length increased, the extent of a depletion layer is more widened than the extent of depletion layer of the prior art. There are accordingly eliminated the need of one or both of the gate-controlled offset portion and the ordinary offset region required for electric field moderation at the drain end.

BRIEF DESCRIPTION OF THE DRAWINGS

The above and other objects, features and advantages of the present invention will become more apparent from the following description when taken in conjunction with the accompanying drawings in which preferred embodiments of the present invention are shown by way of illustrative examples.

DETAILED DESCRIPTION OF THE PREFERRED EMBODIMENTS

In what follows, there will be described preferred embodiments of the present invention with reference to the accompanying drawings. Referring to FIG. 2, a fabrication process of the first embodiment of the present invention is illustrated in the form of a longitudinal sectional view. The present embodiment is suitable for a lower gate type n type transistor.

Figure 1A:
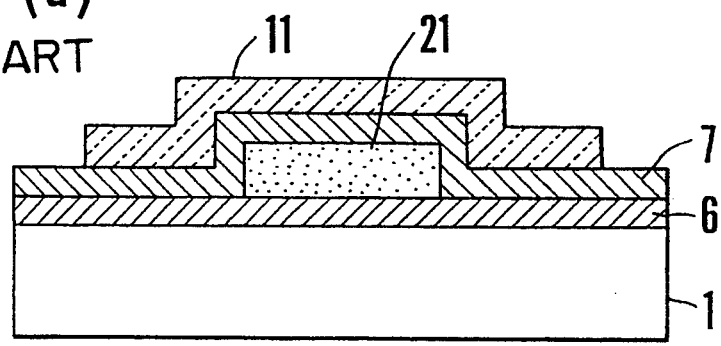
FIGS. 1(a) and 1(b) are views illustrating a fabrication process of a prior art lower gate type thin film transistor.
Figure 1B:
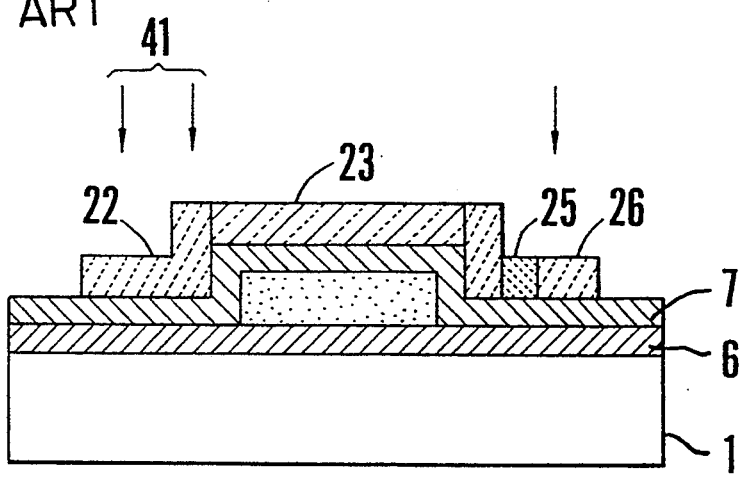
Figure 2A:
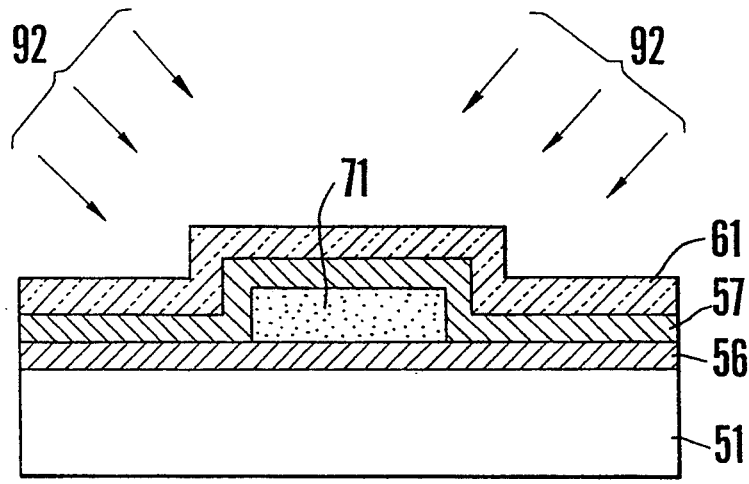
FIGS. 2(a), 2(b), and 2(c) are views illustrating a fabrication process of a lower gate type n type transistor according to a first embodiment of the present invention.

In FIG. 2(a), a silicon oxide film 56 is formed on a silicon substrate 51 as in the case of the prior art example. Thereafter, a polycrystalline silicon film involving a high concentration impurity doped there into is deposited on the silicon oxide film 56, which is in turn patterned to form a 200 nm thick lower gate electrode 71. On the lower gate electrode 71 a silicon oxide film 57 as a gate insulating film is deposited by 25 nm. On the silicon oxide film 57 an amorphous silicon film is deposited by 55 nm and heat-treated at 600° C. for 10 hours for its polycrystallization to form a thin polycrystalline silicon film 61 as an active region.

For doping into a channel part 73, $1 \times 10^{13}$ cm$^{-2}$ boron ion 92 is doped into the polycrystalline silicon film 61. For doping also into side walls, etc., of the film the foregoing doping is carried out slantingly about 45 degrees with respect to a wafer surface, rotating the wafer.

Figure 2B:
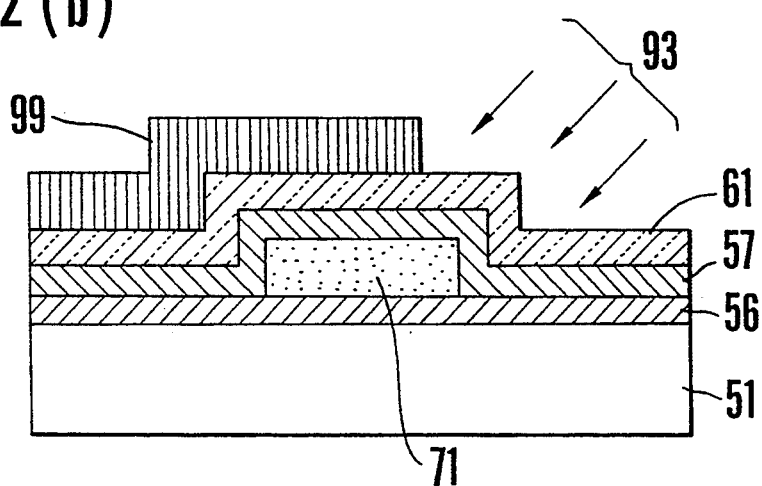
Figure 2C:
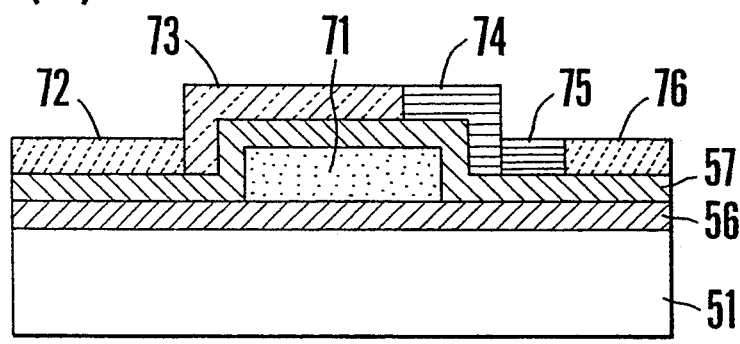

In FIG. 2(b), for obtaining a gate-controlled offset region 74 and an offset region 75 in the polycrystalline silicon film 61, as illustrated in FIG. 2(c), an impurity is introduced into a gate upper surface and side surfaces with a patterned photoresist film 99 taken as a mask. In this case, $1 \times 10^{13}$ cm$^{-2}$ arsenic ion 93 as the impurity is doped slantingly, rotating the wafer.

Thereafter, in FIG. 2(c), $1 \times 10^{15}$ cm$^{-2}$ arsenic ion is partly doped perpendicularly to the wafer with a photoresist film patterned anew taken as a mask to form a source region 72 and a drain region 76 which regions are in turn heat-treated to activate the impurity. Thereafter, as in an ordinary fabrication process, a silicon nitride film is formed as a cover and wiring is laid.

A measurement of a resulting transistor exhibits a 50 fA leakage current which is an improvement compared with 100 fA of an ordinary polycrystalline silicon transistor fabricated simultaneously. An on-current is 2 μA which is an improvement by one figure compared with 0.2 μA of an ordinary polycrystalline silicon transistor fabricated simultaneously.

Referring to FIG. 3, the second embodiment of the present invention is illustrated.

The embodiment is suitable for a lower gate type n type transistor. This is different from the first embodiment in that as illustrated in FIG. 3(c) a gate height is set to be 0.5 μm, the same order as a gate length, and that a gate-controlled offset region 124 is provided on a gate side wall as a drain end of a channel part 123 not on the upper surface of a gate electrode 121.

Figure 3A:
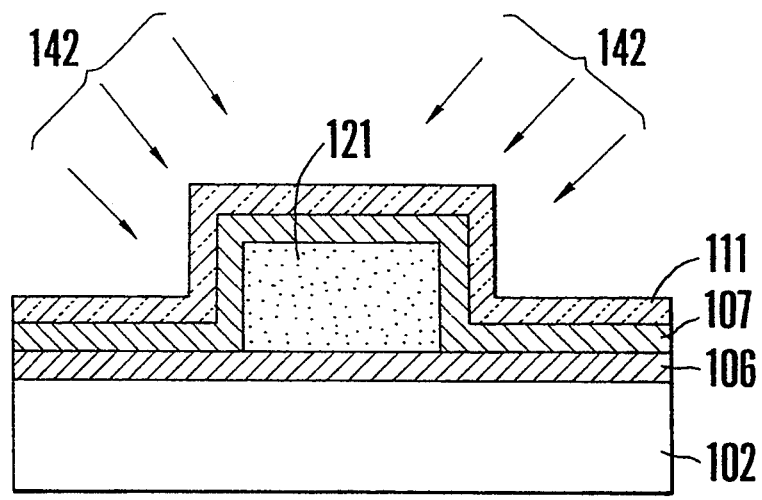
FIGS. 3(a), 3(b), and 3(c) are views illustrating a fabrication process of a lower gate type n type transistor according to a second embodiment of the present invention.

As illustrated in FIG. 3(a), after a silicon oxide film 106 is formed on a glass substrate 102 as in FIG. 2, about 0.5 μm thick polycrystalline silicon involving a high concentration impurity doped thereinto is deposited on the silicon oxide film 106 and patterned to form a lower gate electrode 121. On the lower gate electrode 121 a 30 nm silicon oxide film 107 as a gate insulating film is deposited.

Figure 3B:
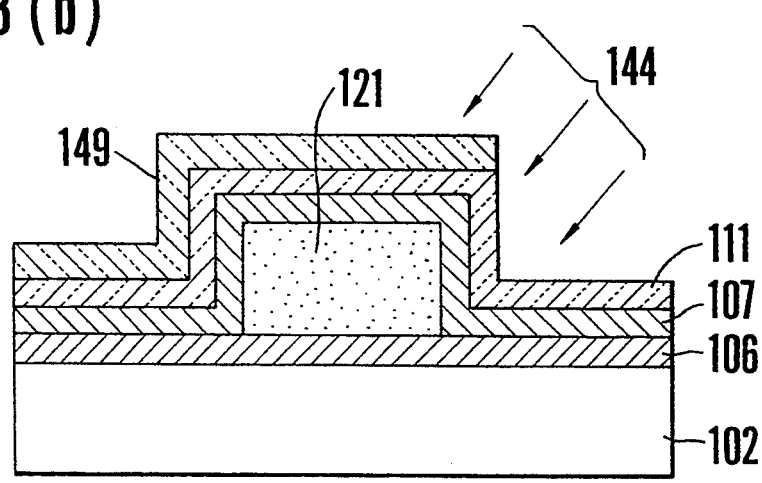
Figure 3C:
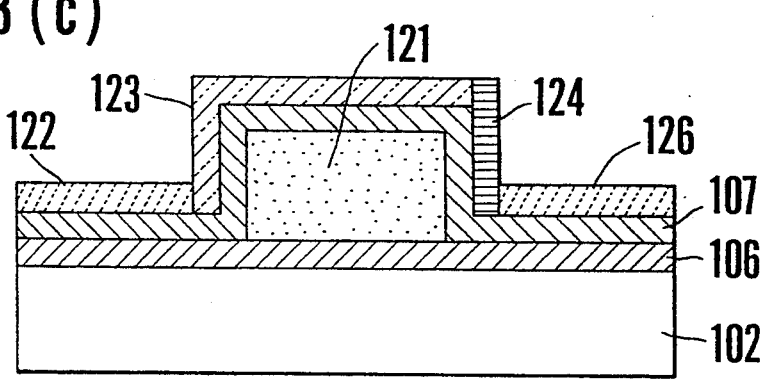

Further, on the resulting silicon oxide film 107 a 40 nm amorphous silicon film is deposited and heat-treated at 600° C. for 12 hours for polycrystalization of amorphous silicon. For doping into the channel part 123, $1 \times 10^{12}$ cm$^{-2}$ dose boron ion 142 is doped slantingly over the entire surface of a polycrystalline silicon film 111, rotating a wafer, to form a thin polycrystalline silicon film 111 as an active region. In FIG. 3(b), with a patterned photoresist 149 taken as a mask, $5 \times 10^{15}$ cm$^{-2}$ dose phosphorus ion 144 is doped slantingly at about 45 degrees rotating the wafer. This portion forms a gate-controlled offset region 124.

In consequence, even in the case where a two-dimensional gate length can not be formed exceeding d μm because of the use of a photolithography technique and an etching technique, the gate-controlled offset region can be formed on the gate side wall. This substantially eliminates the need of a space between the source region and the drain region. Accordingly, there can be ensured a structure which includes the gate-controlled offset region with the gate length of the fabrication limit.

Thereafter, as illustrated in FIG. 3(c), $1 \times 10^{15}$ cm$^{-1}$ phosphorus ion is partly doped with a photoresist film patterned anew as a mask to form a source region 122 and a drain region 126. The impurity is activated by a heat-treatment, and thereafter a cover silicon nitride film and wiring are formed likewise an ordinary fabrication process.

A measurement of a resulting transistor demonstrates a 60 fA leakage current which is an improvement by 1/6 compared with 0.4 pA of an ordinary polycrystalline silicon transistor fabricated simultaneously. An on-current is 1.5 $\mu$A which manifests an improvement by 5 times compared with 300 nA of an ordinary polycrystalline silicon transistor possessing an offset portion manufactured simultaneously.

Referring to FIG. 4, there is illustrated the third embodiment of the present invention.

The embodiment is suitable for a lower gate type p type transistor. This is different from the first and second embodiments in that a gate-controlled offset region 174 is provided only on part of the side wall of the gate adjacent to a channel region 173 as illustrated in FIG. 4(c). A gate electrode 171 is formed into an about 0.5 $\mu$m height which is higher than the case of FIG. 2, as in FIG. 3.

Figure 4A:
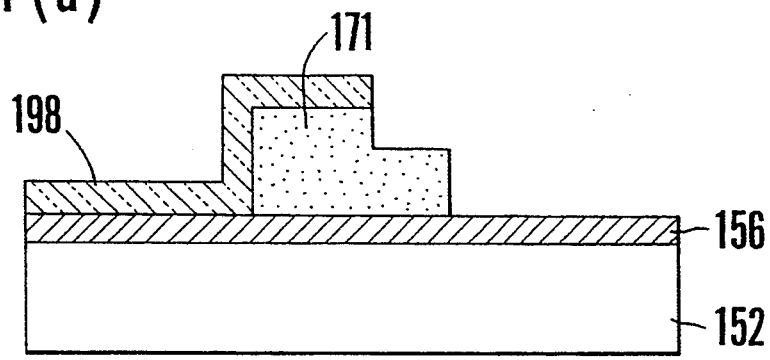
FIGS. 4(a), 4(b), and 4(c) are views illustrating a lower gate type p type transistor according to a third embodiment of the present invention.

For a fabrication procedure, in FIG. 4(a), after a silicon oxide film 156 is formed on a glass substrate 152 as in the cases of FIGS. 2 and 3, a polycrystalline silicon film involving an impurity doped at high concentration is deposited by 0.5 $\mu$m, thicker than that in FIG. 2, on the silicon oxide film 156 and is then patterned. Further, using a patterned photoresist film 198 taken as a mask a lower gate electrode 171 is formed with a gate electrode height at a drain end set to be 0.4 $\mu$m.

Figure 4B:
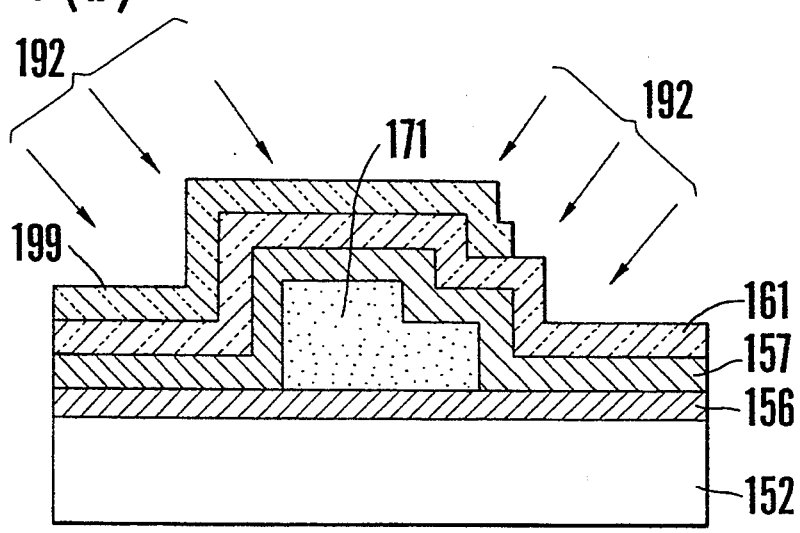
Figure 4C:
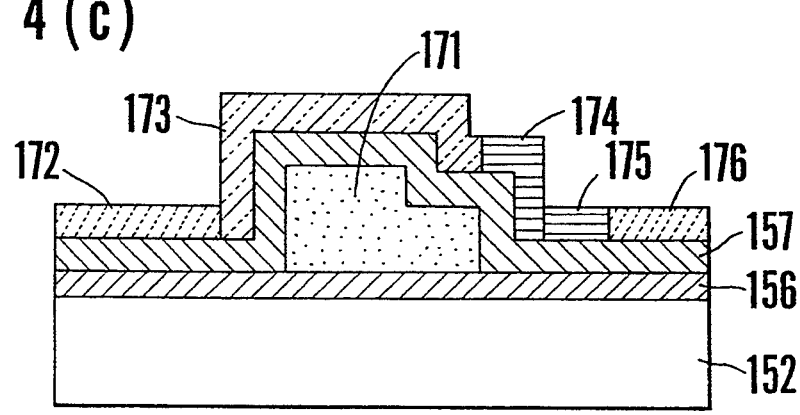

In FIG. 4(b), on the lower gate electrode 171 a silicon oxide film 157 as a gate insulating film is deposited by 20 nm. Further, on the silicon oxide film 157 a 60 nm amorphous silicon film is deposited and heat-treated at 600° C. for 12 hours for polycrystallization of amorphous silicon. Using a patterned photoresist 199 as a mask $1 \times 10^{12}$ cm$^{-2}$ dose boron ion is doped slantingly, rotating a wafer. This portion forms a gate-controlled offset region 174 and an offset region 175. $8 \times 10^{12}$ cm$^{-2}$ dose phosphorus ion is doped in the directions of the drain and the source for doping into a channel part 173 to form a thin polycrystalline silicon film 161 as an active region.

Thereafter, using a photoresist film patterned anew $1 \times 10^{15}$ cm$^{-2}$ boron ion is partly doped to form a source region 172 and a drain region 176. The part involving the impurity is heat-treated, and thereafter a cover silicon nitride film is formed as in an ordinary fabrication process and wiring is laid.

A measurement of a resulting transistor exhibits a 30 fA leakage current, improved by one figure compared with 0.3 pA of an ordinary polycrystalline silicon transistor fabricated simultaneously. An on-current is 4 $\mu$A, improved by one figure or more compared with 300 nA of an ordinary polycrystalline silicon transistor possessing an offset portion fabricated simultaneously.

Referring further to FIG. 5, the fourth embodiment of the present invention is illustrated.

The embodiment is suitable for a lower gate type p type transistor. This is different from the first through third embodiments in that a gate height is increased compared with the cases of the second and the third embodiments, i.e., 0.7 $\mu$m greater than a gate length, and that there are eliminated the gate-controlled offset region and the offset region.

Figure 5A:
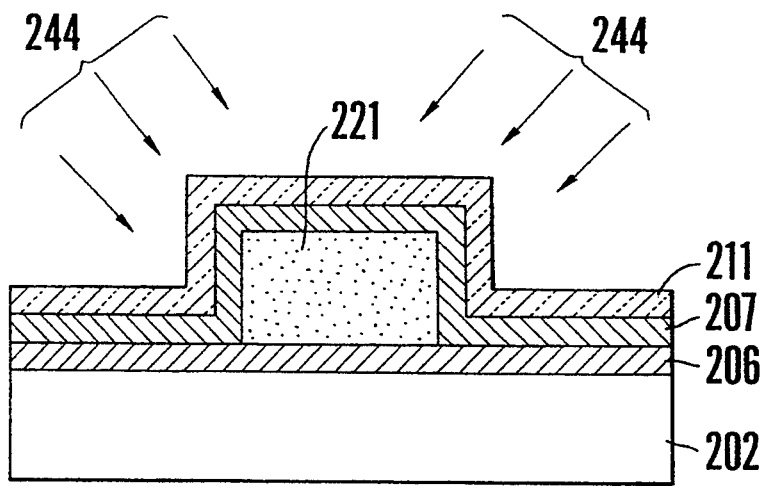
FIGS. 5(a) and 5(b), and 5(c) are views illustrating a fabrication process of a lower gate type p type transistor according to a fourth embodiment of the present invention.

In FIG. 5(a), for a fabrication procedure, after a silicon oxide film 206 is formed on a glass substrate 202 as in the cases of FIGS. 2 and 3, a thick polycrystalline silicon film involving a high concentration impurity doped thereinto is deposited by 700 nm, thicker than the cases of FIGS. 2 and 3 is patterned to form a lower gate electrode 221. On the lower gate electrode 221 a 15 nm silicon oxide film 207 as a gate insulating film is deposited.

Further, on the silicon oxide film 207 a 55 nm amorphous silicon film is deposited and is heat-treated at 600° C. for 12 hours for polycrystallization of silicon. Using a patterned photoresist as a mask $4 \times 10^{12}$ cm$^{-2}$ dose phosphorus ion 244 is doped slantingly, rotating a wafer for doping into a channel part 223 to form a thin polycrystallization silicon film 211 as an active region.

Figure 5B:
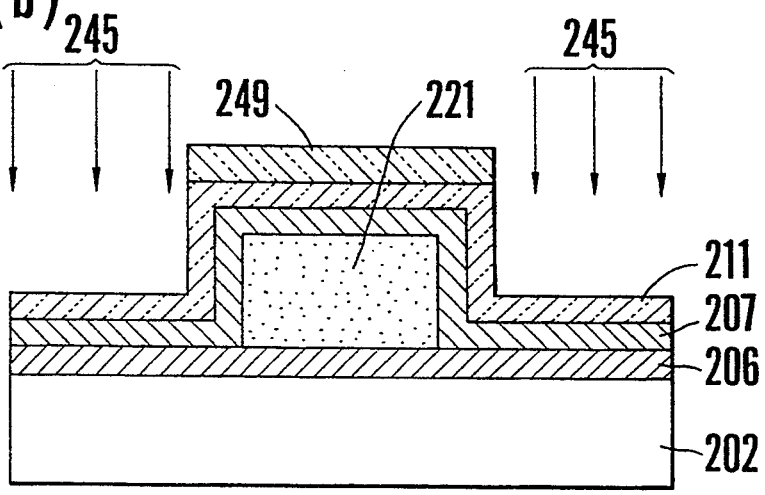
Figure 5C:
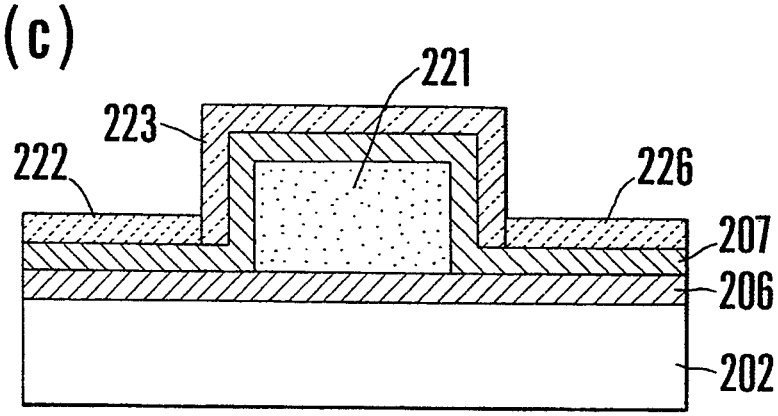

Thereafter, $1 \times 10^{15}$ cm$^{-2}$ BF$_2$ ion 245 is partly doped using a photoresist film 249 patterned anew as illustrated in FIG. 5(b) to form a source region 222 and a drain region 226 as illustrated in FIG. 5(c) and the involved impurity is activated with a heat-treatment. Thereafter, a cover silicon nitride film is formed as in an ordinary fabrication process, and wiring is laid.

A measurement of a resulting transistor exhibits a 100 fA leakage current, improved compared with 0.3 pA of an ordinary polycrystalline silicon transistor fabricated simultaneously. An on-current is 1 $\mu$A, improved compared with 200 nA of an ordinary polycrystalline silicon transistor involving an offset portion manufactured simultaneously.

The aforementioned four embodiments manifest a conspicuous increase of the on-current, which is considered to be the effect of the control of the offset part by the gate. Further, since owing to electric field moderation and an increased effective gate length a channel length where the onset of a short channel effect is provided, which is typically about 0.6 $\mu$m on the mask, can be shortened to about 0.3 $\mu$m in the embodiments.

According to the semiconductor device of the present invention, as described above, the provision of a gate controlled offset part controlled by a gate ensures an conspicuous increase of the on-current, and the increased gate height ensures an increased gate length with a two-dimensional gate occupation area kept unchanged. This effectually restricts the short channel effect as well as the off-current.

What is claimed is:

1. A lower gate type semiconductor device comprising:
   a substrate;
   an insulating layer formed on said substrate;
   a gate electrode disposed on said substrate via said insulating layer;
   a gate insulating layer formed on said gate electrode;
   a channel region as an active region disposed above and in contact with said gate insulating layer and to overlap said gate electrode;
   a source region disposed on one side of said channel region;

a drain region disposed on the other side of said channel region;

said gate electrode serving to control conduction of said channel region located between said source region and said drain region by being supplied with voltage;

a gate-controlled offset portion composed of a semiconductor material formed at the end of said drain region in said channel region and being controlled by said gate electrode in an electric field effect manner, said portion serving to increase an effective gate length;

said channel region and said gate-controlled offset portion having different effective concentration of impurities so that said gate-controlled offset portion weakens the electric field effect established in an area between said channel region and said drain region at the time of non-conduction of the device and decreases resistance of said area at the time of conduction of the device.

2. A lower gate type semiconductor device according to claim 1, wherein said gate-controlled offset portion has a lower concentration of impurity than said drain region.

3. A lower gate type semiconductor device according to claim 1, further comprising an offset region formed adjacent to said gate-controlled portion on said gate insulating layer.

4. A lower gate type semiconductor device comprising:

a substrate;

an insulating layer formed on said substrate;

a gate electrode disposed on said substrate via said insulating layer;

a gate insulating layer formed on said gate electrode;

a channel region as an active region disposed above and in contact with said gate insulating layer and to overlap said gate electrode;

a source region disposed on the other side of said channel region;

a drain region disposed on the other side of said channel region;

said gate electrode serving to control conduction of said channel region located between said source region and said drain region by being supplied with voltage;

a gate-controlled portion composed of a semiconductor material formed at an end of said drain region in said channel region and being controlled by said gate electrode in an electric field effect manner, said portion serving to increase an effective gate length;

said portion having a lower effective concentration of impurity than said channel region, a gate-controlled portion composed of a semiconductor material formed at the end of said drain region in said channel region and being controlled by said gate electrode in an electric field effect manner, said portion serving to increase an effective gate length;

said gate-controlled portion having a lower effective concentration of impurity than said channel region, said gate-controlled portion functioning to weaken the electric field effect established in an area between said channel region and said drain region at a time of non-conduction of the device and to decrease resistance of said area at the time of conduction of the device.

5. A lower gate type semiconductor device according to claim 4, wherein said gate electrode has a height which is substantially the same order as a gate length.

6. A lower gate type semiconductor device according to claim 5, wherein said gate electrode has a stepped upper surface.

7. A lower gate type semiconductor device comprising:

a substrate;

an insulating layer formed on said substrate;

a gate electrode disposed on said substrate via said insulating layer;

a gate insulating layer formed on said gate electrode;

a channel region as an active region disposed on said gate electrode via said gate insulating layer;

a source region disposed on one side of said channel region;

a drain region disposed on the other side of said channel region;

said gate electrode serving to control conduction of said channel region located between said source region and said drain region by being supplied with voltage;

a gate-controlled offset portion composed of a semiconductor material formed at an end of said drain region in said channel region and being controlled by said gate electrode in an electric field effect manner, said offset portion serving to increase an effective gate length;

said channel region and said gate-controlled offset portion being of different conductivity type and said gate electrode has a height which is substantially the same as a gate length, said gate-controlled offset portion functioning to weaken the electric field effect established in an area between said channel region and said drain region at a time of non-conduction of the device and to decrease resistance of said area at a time of conduction of the device.

8. A lower gate semiconductor device according to claim 7, wherein said channel region has a higher concentration of impurity than said gate-controlled offset portion.

9. A lower gate type semiconductor device comprising:

a substrate;

an insulating layer formed on said substrate;

a gate electrode formed on said insulating layer, said gate electrode having an upper surface and side surfaces connecting said upper surface to said insulating layer;

a gate insulating layer formed at least on said upper surface and side surfaces of said gate electrode;

a continuous semiconductor layer formed on said gate insulating layer and having a channel region, a gate-controlled offset region, a drain region and a source region, said channel region being positioned over said upper surface and a first side surface of said gate electrode, a conductivity type of said channel region being a first conductivity type, said gate-controlled offset region being formed over a second side surface of said gate electrode connected to said channel region, said drain region being formed on said gate insulating layer in contact with said gate-controlled offset region at said second side surface of said gate electrode, a conductivity type of said drain region being a second conductivity type, said second conductivity type being different from said first conductivity type, said source region being formed on said gate insulating layer in contact with said channel region at said first side surface of said gate electrode, a conductivity type of said source region being said second conductivity type;

a conductivity type of said gate-controlled offset region being said second conductivity type and an effective carrier concentration of said gate-controlled offset region being lower than an effective carrier concentration of said drain region.

10. A lower gate type semiconductor device according to claim 9, wherein said continuous semiconductor layer has an offset region, said offset region being formed on said gate insulating layer, connected to said gate-controlled offset region at said second side surface of said gate electrode, and said offset region being connected to said drain region on said gate insulating layer.

11. A lower gate type semiconductor device according to claim 9, wherein said first conductivity type being p type and said second conductivity type being n type.

12. A lower gate type semiconductor device according to claim 9, wherein said first conductivity type being n type and said second conductivity type being p type.

13. A lower gate type semiconductor device according to claim 11, wherein a height of said gate electrode is greater than half of the length of said gate electrode.

14. A lower gate type semiconductor device according to claim 12, wherein a height of said gate electrode is greater than half of the length of said gate electrode.

15. A lower gate type semiconductor device according to claim 11, wherein said insulating layer is made of silicon oxide.

16. A lower gate type semiconductor device according to claim 12, wherein said insulating layer is made of silicon oxide.

17. A lower gate type semiconductor device according to claim 13, wherein said insulating layer is made of silicon oxide.

18. A lower gate type semiconductor device according to claim 14, wherein said insulating layer is made of silicon oxide.

19. A lower gate type semiconductor device according to claim 11, wherein said substrate is made of silicon.

20. A lower gate type semiconductor device according to claim 12, wherein said substrate is made of silicon.

21. A lower gate type semiconductor device according to claim 11, wherein said substrate is made of glass.

22. A lower gate type semiconductor device according to claim 12, wherein said substrate is made of glass.

23. A lower gate type semiconductor device according to claim 11, wherein said gate electrode includes polycrystalline silicon with high concentration impurity.

24. A lower gate type semiconductor device according to claim 12, wherein said gate electrode includes polycrystalline silicon with high concentration impurity.

25. A lower gate type semiconductor device according to claim 11, wherein said gate insulating layer is made of silicon oxide.

26. A lower gate type semiconductor device according to claim 12, wherein said gate insulating layer is made of silicon oxide.

27. A lower gate type semiconductor device comprising:

a substrate;

an insulating layer formed on said substrate;

a gate electrode formed on said insulating layer, said gate electrode having an upper surface and side surfaces connecting said upper surface to said insulating layer;

a gate insulating layer formed at least on said upper surface and side surfaces of said gate electrode;

a continuous semiconductor layer formed on said gate insulating layer and having a channel region, a gate-controlled offset region, a drain region and a source region, said channel region being positioned over said upper surface and a first side surface of said gate electrode, a conductivity type of said channel region being a first conductivity type, said gate-controlled offset region being formed over a second side surface of said gate electrode, connected to said channel region, said drain region being formed on said gate insulating layer in contact with said gate-controlled offset region at said second side surface of said gate electrode, a conductivity type of said drain region being a second conductivity type, said second conductivity type being different from said first conductivity type, said source region being formed on said gate insulating layer in contact with said channel region at said first side surface of said gate electrode, a conductivity type of said source region being said second conductivity type;

a conductivity type of said gate-controlled offset region being said first conductivity type and an effective carrier concentration of said gate-controlled offset region being lower than an effective carrier concentration of said channel region.

28. A lower gate type semiconductor device according to claim 27, wherein said continuous semiconductor layer has an offset region, said offset region being formed on said insulating layer connected to said gate-controlled offset region at said second side surface of said gate electrode, said offset region being connected to said drain region on said gate insulating layer.

29. A lower gate type semiconductor device according to claims 27, wherein said first conductivity type being p type and said second conductivity type being n type.

30. A lower gate type semiconductor device according to claim 27, wherein said first conductivity type being n type and said second conductivity type being p type.

31. A lower gate type semiconductor device comprising:

a substrate;

an insulating layer formed on said substrate;

a gate electrode formed on said insulating layer, said gate electrode having an upper surface and side surfaces connecting said upper surface to said insulating layer;

a gate insulating layer formed at least on said upper surface and side surfaces of said gate electrode;

a continuous semiconductor layer formed on said gate insulating layer and having a channel region, a gate-controlled offset region, a drain region and a source region, said channel region being positioned on said upper surface and a first side surface of said gate electrode, a conductivity type of said channel region being first conductivity type, said gate-controlled offset region being formed over a second side surface of said gate electrode connected to said channel region, said drain region being formed on said gate insulating layer in contact with said gate controlled offset region at said second side surface of said gate electrode, a conductivity type of said drain region being a second conductivity type, said second conductivity type being different from said first conductivity type, said source region being formed on said gate insulating layer in contact with said channel region at said first side surface of said gate electrode, a conductivity type of said source region being said second conductivity type, said gate-controlled offset region being of a semiconductor material and having a different effective concentration of impurities than that of said channel region.

32. A lower gate type semiconductor device according to claim 31, wherein said continuous semiconductor layer has an offset region, said offset region being formed on said gate insulating layer, connected to said gate-controlled offset region at said second side surface of said gate electrode, and said offset region being connected to said drain region on said gate insulating layer.

33. A lower gate type semiconductor device according to claim 31, wherein said first conductivity type being p type and said second conductivity type being n type.

34. A lower gate type semiconductor device according to claim 31, wherein said first conductivity type being n type and said second conductivity type being p type.

* * * * *